(12) United States Patent
Bayraktaroglu

(10) Patent No.: US 6,724,067 B2
(45) Date of Patent: Apr. 20, 2004

(54) LOW STRESS THERMAL AND ELECTRICAL INTERCONNECTS FOR HETEROJUNCTION BIPOLAR TRANSISTORS

(75) Inventor: Burhan Bayraktaroglu, Yellow Springs, OH (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 10/265,548

(22) Filed: Oct. 7, 2002

(65) Prior Publication Data

US 2003/0038341 A1 Feb. 27, 2003

Related U.S. Application Data

(63) Continuation-in-part of application No. 10/123,899, filed on Apr. 15, 2002, now abandoned.
(60) Provisional application No. 60/283,624, filed on Apr. 13, 2001.

(51) Int. Cl.[7] ............................................. H01L 27/082

(52) U.S. Cl. ....................... 257/579; 257/664; 257/666; 257/690; 257/774

(58) Field of Search .................... 257/579, 666, 257/664, 690, 774

(56) References Cited

U.S. PATENT DOCUMENTS

| | | | |
|---|---|---|---|
| 2,470,775 A | | 5/1949 | Jernstedt et al. |
| 3,896,479 A | | 7/1975 | Di Lorenzo et al. |
| 4,670,297 A | | 6/1987 | Lee et al. |
| 4,857,481 A | | 8/1989 | Tam et al. |
| 5,084,750 A | | 1/1992 | Adlerstein |
| 5,219,713 A | | 6/1993 | Robinson |
| 5,266,183 A | | 11/1993 | Dauksher et al. |
| 5,318,687 A | | 6/1994 | Estes et al. |
| 5,408,742 A | * | 4/1995 | Zaidel et al. ............... 438/619 |
| 5,662,788 A | | 9/1997 | Sandhu et al. |
| 5,686,743 A | | 11/1997 | Lammert |
| 5,734,193 A | | 3/1998 | Bayraktaroglu et al. |
| 5,783,966 A | | 7/1998 | Hill et al. |
| 5,789,301 A | | 8/1998 | Hill |
| 5,859,447 A | | 1/1999 | Yang et al. |
| 6,013,573 A | | 1/2000 | Yagi |
| 6,028,348 A | * | 2/2000 | Hill ............................ 257/666 |
| 6,036,833 A | | 3/2000 | Tang et al. |

* cited by examiner

Primary Examiner—Richard Elms
Assistant Examiner—Douglas Menz

(57) ABSTRACT

A thermal and electrical interconnect for heterojunction bipolar transistors is disclosed wherein the interconnect is essentially comprised of gold and in thermal and electrical contact with each of the interdigitated emitter fingers and is capable of transporting heat fluxes between 0.25–1.5 mW/$\mu$m2. The interconnect is electrodeposited to form a low-stress interface with the emitter finger, thereby increasing the lifetime and reliability of the transistor.

17 Claims, 4 Drawing Sheets

LOW STRESS THERMAL AND ELECTRICAL INTERCONNECTS FOR HETEROJUNCTION BIPOLAR TRANSISTORS

CROSS-REFERENCE TO RELATED APPLICATIONS

This application is a continuation-in-part of U.S. application Ser. No. 10/123,899 filed on Apr. 15, 2002, now abandoned which claims priority from U.S. Provisional Application Serial No. 60/283,624 filed on Apr. 13, 2001.

FIELD OF THE INVENTION

The present invention relates to the field of interconnect design and fabrication for semiconductor electronics.

BACKGROUND OF THE INVENTION

Citation or identification of any reference in this Section or any section of this application shall not be construed that such reference is available as prior art to the present invention.

Heterojunction bipolar transistors ("HBT"s) fabricated on GaAs substrates using AlGaAs or InGaP emitters are suitable for efficient microwave power amplification. The high power generation requires the use of multiple emitter fingers spread over a large surface area to provide adequate thermal management (adequate heat dissipation and thermal uniformity) of the device.

For proper operation of the transistor, all parts of the device must be connected together so that the resulting power device exhibits uniform electrical and thermal characteristics. Because of the poor thermal conductance of the GaAs substrate, the ideal thermal and electrical designs often have contradictory requirements. For instance, better thermal designs require the emitter fingers to be spread apart, whereas better electrical designs require the same emitter fingers to be closely spaced. In practical device designs, several emitter fingers are co-located in a sub-cell, and multiple sub-cells are then re-connected within the device. The connection of emitter fingers within the sub-cell with low thermal resistance and low electrical resistance metals provide substantial stability against thermal runaway.

FIG. 1 shows a side cut view of a conventional GaAs-based HBT. An interconnect 120 provides electrical and thermal communication between each of the emitter fingers 102 in the HBT 100. Base fingers 104 are electrically insulated from the interconnect 120 by spacers 110. The spacers 110 prevent the interconnect 120 from creating an electrical short between the base fingers 104 and the emitter fingers 102. The spacers 110 may be any dielectric material such as silicon nitride, silicon dioxide or polyimide. Although the spacers 110 provide the necessary electrical insulation between the emitter fingers 102 and base fingers 104, the spacers also create undesirable electrical parasitic capacitance between the emitter and the base terminals in the HBT 100. This parasitic capacitance lowers the input impedance of the HBT and adversely impacts the microwave gain characteristics thereby degrading the high frequency performance of the HBT.

The fabrication of the interconnect 120, generally referred to as metallization, may be accomplished by sputtering, evaporation, or electroplating. The metallization process usually creates residual stress in the interconnect 120 that appears as an interfacial stress 150 acting on the emitter fingers 102. The interfacial stress may result in delamination of the emitter finger 102 from the interconnect 120 or from the underlying substrate 106 leading to a failure of the HBT. Even if the interfacial stress is not sufficient to cause delamination, the persistent interfacial stress degrades the long term reliability of the HBT. For instance, without intending to be bound by any theory, it is believed that the persistent interfacial stress enhances the creation of lattice defects during the normal operation of the device. Defects in HBTs at the interface or in the base layer may act as recombination centers thereby reducing the current gain. Further, such recombinations may release energy into the crystal lattice, which if under stress, may tend to create additional defects. This is a long term degradation mechanism for GaAs-based HBTs.

U.S. Pat. No. 5,734,193 issued to Bayraktaroglu, et al. on Mar. 31, 1998 ("Bayraktaroglu") discloses the use of an air bridge to electrically insulate the emitter fingers from the base fingers while reducing the parasitic emitter-base capacitance by using air as the low dielectric spacer material. Bayraktaroglu, however, does not teach creating a low residual stress electrical contact.

U.S. Pat. No. 5,318,687 issued to Estes et al. on Jun. 7, 1994 ("Estes") discloses a process of electrodepositing thin (between 0.6–0.7 $\mu$m) gold X-ray lithography masks having low residual stress by using a plating bath containing between 8 to about 30 mg of arsenite per liter. Estes discloses using a 1.7 $\mu$m thick polyimide as the plating base upon which the gold is directly deposited. Estes also discloses the use of 2.5 $\mu$m thick heavily doped silicon as an alternative plating base along with other materials such as silicon nitride, silicon carbide, boron nitride, boron carbide, carbon (diamond), or other polymers. Estes does not, however, disclose depositing gold directly onto GaAs. Estes does not teach the problem of reducing parasitic capacitance while providing good thermal control of emitter fingers in GaAs-based HBTs.

Therefore, there remains a need for an interconnect for improved GaAs-based HBTs that provides for (a) adequate heat dissipation, (b) uniform emitter temperatures, and (c) low parasitic emitter-base capacitance.

SUMMARY OF THE INVENTION

In one embodiment, an interconnect for a heterojunction bipolar transistor having interdigitated emitter and base fingers is disclosed wherein the interconnect is essentially comprised of gold having a thickness greater than 1 micrometers, the interconnect in thermal and electrical contact with at least two of the emitter fingers and forming a bridge over each of the base fingers thereby maintaining electrical insulation between the base and emitter with a low emitter-base capacitance, wherein the interconnect is electrodeposited such that residual stress in the interconnect is low, wherein the bridge is an air bridge.

In another embodiment, an interconnect for a heterojunction bipolar transistor having at least two emitter fingers, the interconnect in thermal and electrical contact with at least two emitter fingers, is disclosed wherein the interconnect is electrodeposited to a thickness greater than 1 micrometers. A second interconnect may be thermal and electrical contact with each of the emitter fingers and a lead pad.

In another embodiment, a method of manufacturing an HBT interconnect is disclosed comprising the steps of: providing an HBT comprising an intrinsic device, a base ledge, and a dielectric passivation layer between an emitter contact and a base contact; establishing a post resist pattern characterized by a post resist thickness; depositing a seed metal over the post resist pattern; depositing a thick photoresist covering a portion of the seed metal, an uncovered portion of the seed metal defining a bridge area; plating gold on the uncovered portion of the seed metal forming the interconnect.

BRIEF DESCRIPTION OF THE FIGURES

The present invention may be understood more fully by reference to the following detailed description of the preferred embodiments of the present invention, illustrative examples of specific embodiments of the invention and the appended figures in which:

FIG. 2b is a section view of the embodiment shown in FIG. 2a.

FIG. 2c is another section view of the embodiment shown in FIG. 2a.

DETAILED DESCRIPTION OF THE PREFERRED EMBODIMENT

The problems associated with the current method of interconnection are overcome in this invention by fabricating micro air bridge connections between emitter fingers using low stress plated Au as the interconnected metal. Due to the intrinsic nature of this fabrication technique, the resulting bridge type interconnects have low or no stress due to the metal fabrication. In addition, the spacing between the interconnect metal and the base contacts can be adjusted by the post height to minimize the parasitic capacitance values.

Figure 1:
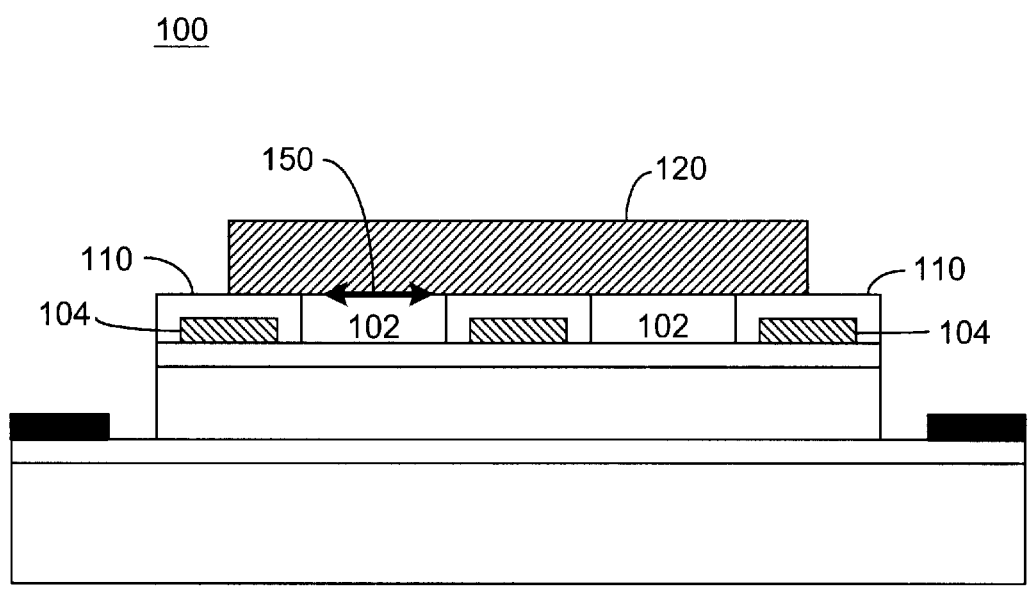
FIG. 1 is a section view of a GaAs-based HBT.
Figure 2A:
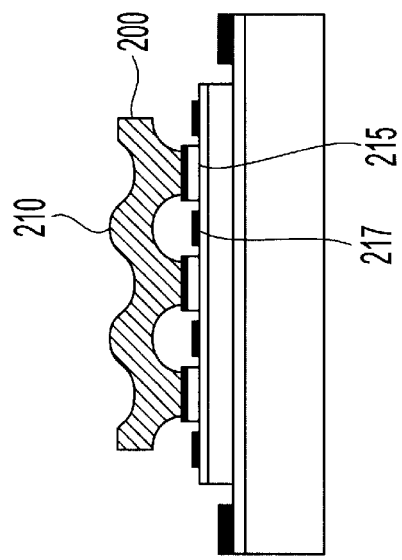
FIG. 2a is a top view on one embodiment of the present invention.
Figure 2B:
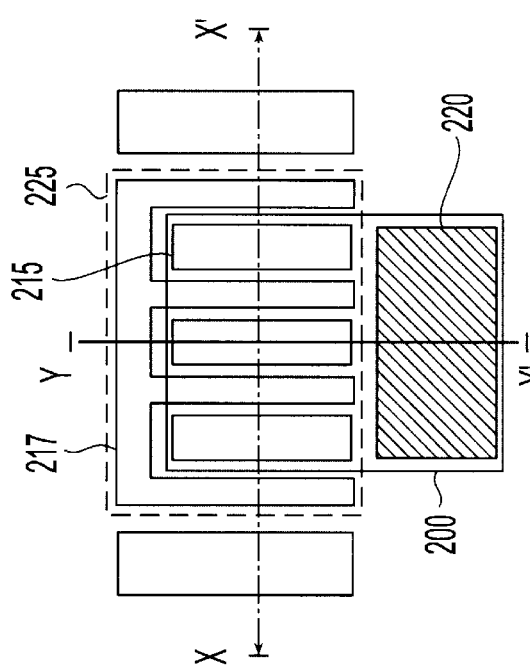
Figure 2C:
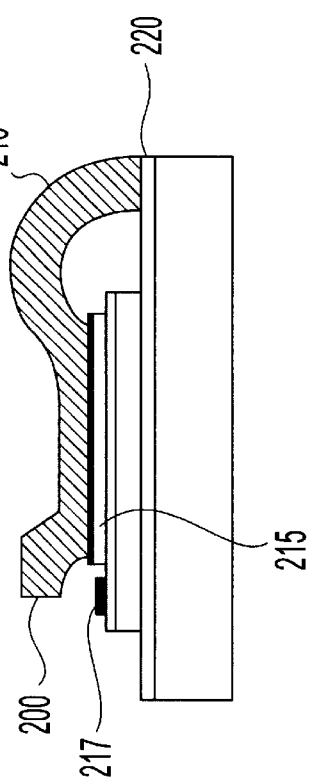

FIG. 2a shows the top view and cross-sectional views of an embodiment of this invention. The air bridge interconnect 200 is fabricated by electroplating. It forms a bridge 210 between the emitter fingers 215 and also connects the fingers 215 to metal leads 220 residing outside of the sub-cell area 225. As shown in the FIG. 2b, the XX' section view of FIG. 2a, the interconnect metal can conduct substantial amount of heat between the fingers 215 to equalize any temperature variations that may arise. In addition to equalizing the temperature in each of the emitter fingers 215, the interconnect forms a low thermal resistance pathway to remove thermal energy from the emitter fingers 215 to areas outside the base pedestal thereby preventing the emitter temperature from increasing beyond its operating range. As shown in the YY' section view of FIG. 2c, the same interconnect provides a thermal path for excess heat to be spread over a larger area outside of the active device.

The thickness of the air bridge may be selected, in part, by the thermal and mechanical properties of the bridge material and may be determined for the specific application by one of skill in the art without undue experimentation. In one embodiment where gold is used as the bridge material to interconnect emitter fingers spaced about 5 $\mu$m or less apart, an average bridge thickness of at least 1 $\mu$m is sufficient to carry heat fluxes ranging from about 0.25 mW/$\mu$m$^2$, expected under normal operating conditions, up to at least 1.5 mW/$\mu$m$^2$. The minimum thickness of 1 $\mu$m provides structural integrity for the air bridge although thicker bridges provide for a more uniform temperature distribution in the emitter fingers while providing for more robust handling of any transient heat flux excursions that may occur in the HBT. In one embodiment, the thickness is between about 1–15 $\mu$m, preferably between about 2–8.5 $\mu$m, and most preferably between about 3–6.5 $\mu$m. In another embodiment, the thickness may be greater than about 1 $\mu$m and less than or equal about 3 $\mu$m, greater than about 3 $\mu$m and less than or equal to about 6 $\mu$m, greater than about 6 $\mu$m and less than about 10 $\mu$m, or greater than about 10 $\mu$m and less than about 15 $\mu$m. In another embodiment, the average bridge thickness may be about 3 $\mu$m, preferably about 6 $\mu$m for better heat dissipation, or even 1 $\mu$m in less demanding applications.

Figure 3:
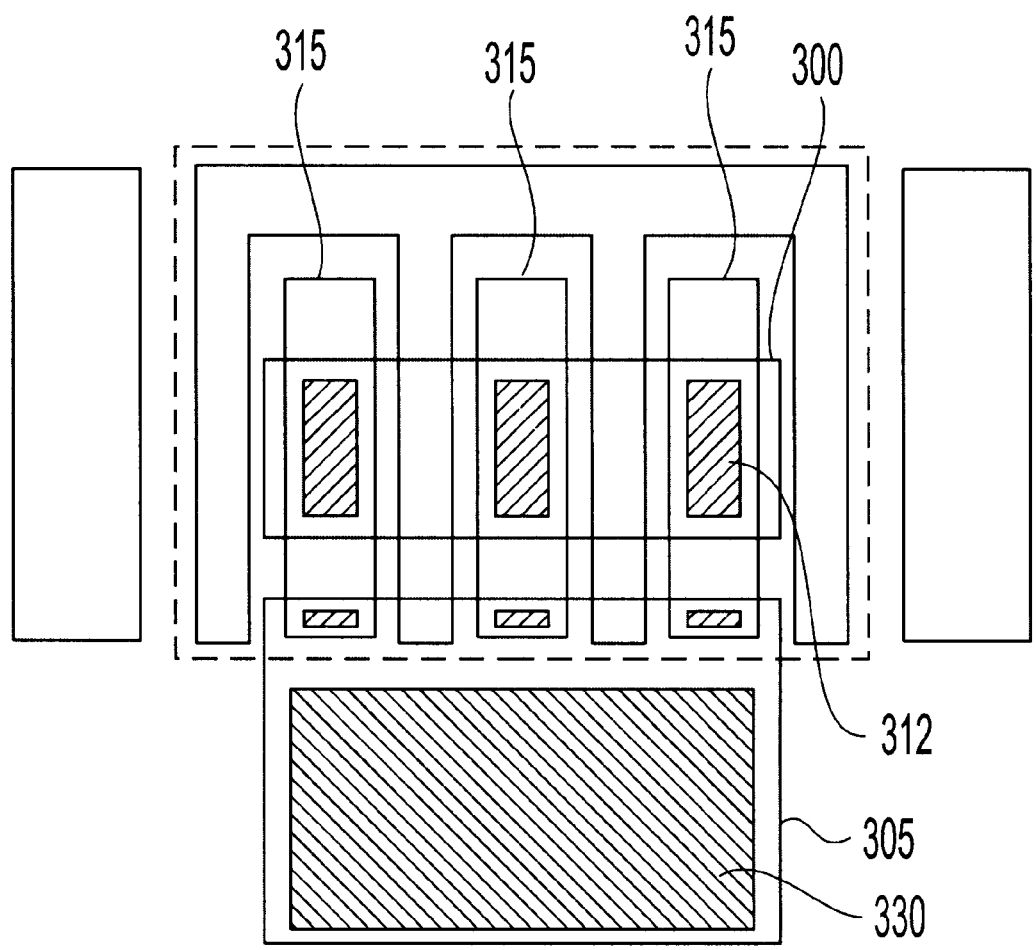
FIG. 3 is a top view of another embodiment of the present invention.

An alternative interconnection scheme shown in FIG. 3 allows simpler fabrication for the micro air bridges by limiting the width of each bridge. In the embodiment shown in FIG. 3, a first interconnect 300 is in thermal and electrical contact with each of the emitter fingers 315. The contact region 312 where the interconnect contacts the emitter finger is preferably located in the middle or central portion of the emitter finger where temperatures may be higher than the temperature at the emitter finger edge. The width of the middle portion 312 may range from 0.30–1.0 the width of the emitter finger 315, preferably between 0.5–0.9 the width of the emitter finger 315, and more preferably between 0.50–0.75 the width of the emitter finger 315. Alternatively, the width of the middle portion 312 may be selected from the following closed (includes end points) ranges: 0.3–0.4, 0.4–0.5, 0.5–0.6, 0.6–0.7, 0.7–0.8, 0.8–0.9, and 0.9–1.0 the width of the emitter finger. The length of the middle portion 312 may range from 0.3–1.0 the length of the emitter finger 315, preferably between 0.5–0.9 the length of the emitter finger 315, and more preferably between 0.5–0.75 the length of the emitter finger 315. Alternatively, the length of the middle portion 312 may be selected from the following closed (includes end points) ranges: 0.3–0.4, 0.4–0.5, 0.5–0.6, 0.6–0.7, 0.7–0.8, 0.8–0.9, and 0.9–1.0 the length of the emitter finger. By limiting its width, the fabrication technique is simplified since the photoresist under the bridge must be removed during fabrication with solvents and narrower bridges allow freer penetration of solvent under the bridges. Also, narrower bridges produce proportionally less parasitic capacitances. The narrower bridges also reduces the magnitude of interfacial stress by reducing the contact area of the interconnect with the emitter finger. The thermal connection provided by the first interconnect 300 keeps each of the emitter fingers 315 at essentially the same temperature thereby improving transistor reliability and performance.

A second interconnect 305 thermally and electrically connects each of the emitter fingers 315 to the lead pad 330. The second interconnect 305 provides the thermal path to remove the heat generated in the emitter fingers from the transistor.

Figure 4A:
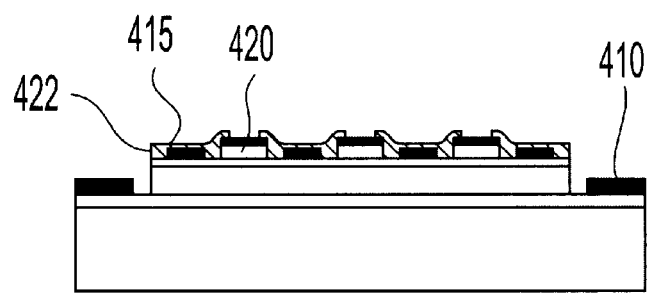
FIG. 4a is a section view of an embodiment of the present invention after initial processing.

The fabrication scheme for this interconnect may follow the GaAs IC fabrication. As shown in FIG. 4a–f, the HBT is fabricated until the collector layers 410 are established. At this point as shown in FIG. 4a, the intrinsic device is complete including base ledges and dielectric passivation layer 415 between the emitter 420 and base 422 contacts.

Figure 4B:
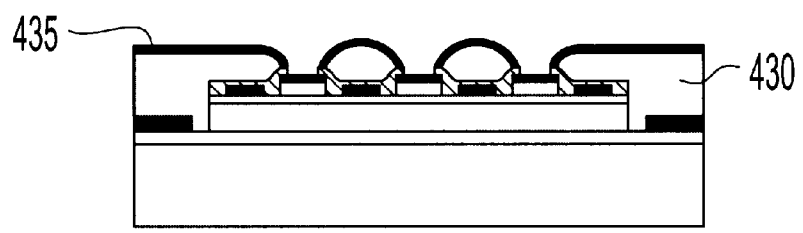
FIG. 4b is a section view of the embodiment shown in FIG. 4a after post resist and seed metal deposition.
Figure 4C:
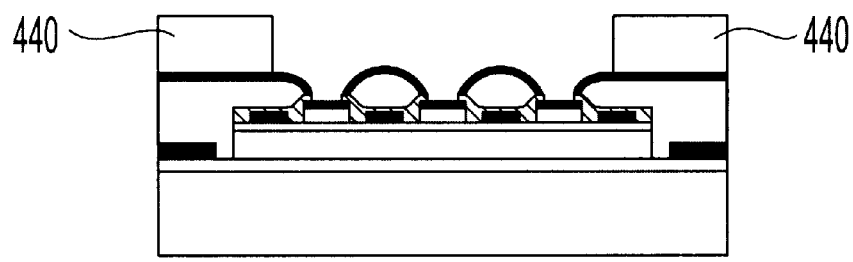
FIG. 4c is a section view of the embodiment shown in FIG. 4b after bridge resist deposition.

The first step in interconnect fabrication is the establishment of the post resist pattern as shown in FIG. 4b. The thickness of the post resist 430 determines the height of the subsequent air bridge. The post resist thickness is preferably greater than 0.5 μm to reduce the parasitic capacitance between the base and emitter. In one embodiment, the post resist thickness may be greater than about 1 μm, preferably between about 2–4 μm, and most preferably between about 3–4 μm. This resist 430 is subsequently hard baked for stability. A sputtered seed metal 435 is fabricated over the post resist 430 to serve as the electrical path for plating current. The bridge areas are then defined with thick photoresist 440 exposing the areas to be plated as shown in FIG. 4c.

Figure 4D:
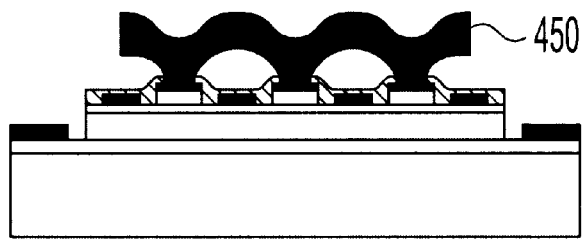
FIG. 4d is a section view of the embodiment shown in FIG. 4c after bridge resist and seed metal removal.

In one embodiment, gold is preferably electroplated by pulse doping with a 2 ms pulse at a 20% duty cycle with a plating current of 3–5 ma/cm$^2$. It is believed, without intending to be bound by any theory, that pulse doping limits grain growth of the deposited metal, which reduces the interfacial stress between the bridge and emitter finger. In alternate embodiments, duty cycles ranging from 5% to 50% and plating currents in the range from 1–10 ma/cm$^2$ may be employed. The plating solution may be a cyanide-based solution such as the SEL-REX® system available from Ethone, Inc. of West Haven, Conn. Non-cyanide-based or less toxic or less hazardous gold plating solutions may also be used such as, for example, Technigold® 25E available from Technic Inc. of Cranston, R.I. After plating at least 1 μm of gold 450, the bridge resist 440, the seed metal 435, and the post resist 430 are stripped sequentially to complete the fabrication of the interconnect as shown in FIG. 4d.

As is apparent, the described invention admits of many variations and modifications without departing from the spirit of the invention. The invention described and claimed herein is not to be limited in scope by the illustrative embodiments disclosed herein. All embodiments that do not depart from the spirit of the invention are intended to be within the scope of this invention. Indeed, various modifications of the invention in addition to those shown and described herein will become apparent to those skilled in the art from the foregoing description and are intended to fall within the scope of the appended claims.

A number of references are cited herein, the entire disclosures of which are incorporated herein, in their entirety, by reference for all purposes. Further, none of these references, regardless of how characterized above, is admitted as prior art to the invention of the subject matter claimed herein.

I claim:

1. An interconnect for a heterojunction bipolar transistor having interdigitated emitter and base fingers wherein the interconnect is essentially comprised of gold having a thickness greater than 1 micrometers, the interconnect in thermal and electrical contact with at least two of the emitter fingers and forming a bridge over each of the base fingers thereby maintaining electrical insulation between the base and emitter with a low emitter-base capacitance, wherein the interconnect is electrodeposited such that residual stress in the interconnect is low, wherein the bridge is an air bridge.

2. An interconnect for a heterojunction bipolar transistor having at least two emitter fingers, the interconnect comprising: a first air bridge in thermal and electrical contact with at least two emitter fingers, wherein the first air bridge is electrodeposited to a thickness greater than 1 micrometers; and a second air bridge in thermal and electrical contact with each of the emitter fingers and a lead pad.

3. The interconnect of claim 2 wherein the interconnect is comprised essentially of electrodeposited gold.

4. The interconnect of claim 2 wherein the interconnect is contacted to a middle portion of an emitter finger, the middle portion characterized by a contact width and contact length, each emitter finger characterized by a emitter width and emitter length.

5. The interconnect of claim 4 wherein the contact width is in a range selected from the group consisting of 0.3–1.0 the emitter finger width, 0.40–0.9 the emitter finger width, and 0.5–0.75 the emitter finger width.

6. The interconnect of claim 4 wherein the contact width is in a range selected from the group consisting of 0.3–0.4 emitter finger width, 0.4–0.5 emitter finger width, 0.5–0.6 emitter finger width, 0.6–0.7 emitter finger width, 0.7–0.8 emitter finger width, 0.8–0.9 emitter finger width, and 0.9–1.0 the emitter finger width.

7. The interconnect of claim 4 wherein the contact length is in a range selected from the group consisting of 0.3–1.0 the emitter finger length, 0.40–0.9 the emitter finger length, and 0.5–0.75 the emitter finger length.

8. The interconnect of claim 4 wherein the contact length is in a range selected from the group consisting of 0.3–0.4 emitter finger length, 0.4–0.5 emitter finger length, 0.5–0.6 emitter finger length, 0.6–0.7 emitter finger length, 0.7–0.8 emitter finger length, 0.8–0.9 emitter finger length, and 0.9–1.0 the emitter finger length.

9. The interconnect of claim 2 wherein the average interconnect thickness is in a range selected from the group consisting of about 1–15 μm, about 2–8.5 μm, about 3–6.5 μm, about 1–3 μm, about 3–6 μm about 6–10 μm, and about 10–15 μm.

10. The interconnect of claim 2 wherein the heat flux transported through the interconnect is in a range selected from the group consisting of at least 0.25 mW/μm$^2$, 0.25–0.5 mW/μm$^2$, 0.5–1.0 mW/μm$^2$, 1.0–1.5 mW/μm$^2$, and greater than 1.5 mW/μm$^2$.

11. The interconnect of claim 2 formed by the steps of:
providing an HBT comprising an intrinsic device, a base ledge, and a dielectric passivation layer between an emitter contact and a base contact;
establishing a post resist pattern characterized by a post resist thickness;
depositing a seed metal over the post resist pattern;
depositing a thick photoresist covering a portion of the seed metal, an uncovered portion of the seed metal defining a bridge area;
plating gold on the uncovered portion of the seed metal forming the interconnect.

12. The interconnect of claim 11 further comprising the step of removing the photoresist after the step of plating gold.

13. The interconnect of claim 12 further comprising the step of removing the seed metal.

14. The interconnect of claim 11 further comprising the step of removing the post resist after the step of plating gold.

15. The interconnect of claim 11 wherein the post resist pattern defines a first interconnect connecting an emitter finger to a second emitter finger.

16. The interconnect of claim 15 wherein the post resist pattern defines a second interconnect connecting the emitter finger to a lead pad.

17. The interconnect of claim 11 wherein plating gold further comprises electroplating by pulse doping.

\* \* \* \* \*